United States Patent [19]

Kajikawa

[11] Patent Number: 4,789,643
[45] Date of Patent: Dec. 6, 1988

[54] METHOD OF MANUFACTURING A HETEROJUNCTION BIPOLAR TRANSISTOR INVOLVING ETCH AND REFILL

[75] Inventor: Yasutomo Kajikawa, Itami, Japan

[73] Assignee: Mitsubishi Denki Kabushiki Kaisha, Tokyo, Japan

[21] Appl. No.: 97,165

[22] Filed: Sep. 16, 1987

[30] Foreign Application Priority Data

Sep. 25, 1986 [JP] Japan .................... 61-228724

[51] Int. Cl.$^4$ ........................... H01L 21/302
[52] U.S. Cl. ........................... 437/31; 437/90; 437/133; 437/228; 437/81; 148/DIG. 11; 148/DIG. 26; 148/DIG. 50; 357/34; 156/652
[58] Field of Search .......... 437/31, 32, 33, 81, 437/89, 90, 91, 126, 133, 225, 228, 203; 148/DIG. 10, DIG. 11, DIG. 50, DIG. 51, DIG. 26; 357/34, 35, 16; 156/652, 656

[56] References Cited

U.S. PATENT DOCUMENTS

| | | | |
|---|---|---|---|
| 3,322,581 | 5/1967 | Hendrickson et al. | 148/DIG. 50 |
| 3,762,966 | 10/1973 | Engeler | 437/90 |
| 4,593,457 | 6/1986 | Birittella | 148/DIG. 84 |
| 4,644,381 | 2/1987 | Shieh | 148/DIG. 11 H |
| 4,663,381 | 5/1987 | Birittella | 148/DIG. 10 |
| 4,716,445 | 12/1987 | Sone | 148/DIG. 11 H |
| 4,746,626 | 5/1988 | Eda et al. | 437/107 |

FOREIGN PATENT DOCUMENTS

0206787 12/1986 European Pat. Off. .

OTHER PUBLICATIONS

S. S. Tan and A. G. Milnes: IEEE Transactions on Electron Devices, vol. ED-30 (1983), P1289-P1294.
P. M. Asbeck, D. L. Miller, R. J. Anderson and F. H. Eisen: IEEE Electron Device Letters, vol. EDL-5 (1984), P310-P312.

*Primary Examiner*—Brian E. Hearn
*Assistant Examiner*—Kevin McAndrews
*Attorney, Agent, or Firm*—Oblon, Fisher, Spivak, McClelland & Maier

[57] ABSTRACT

A heterojunction bipolar transistor and method of manufacturing the same is disclosed in which, a semi-insulation layer and an external base layer sequentially epitaxially grown on a collector layer are selectively mesa-etched through a mask of an insulation film provided with an opening so that the external base layer, the semi-insulation layer and the collector layer are selectively exposed. Subsequently an internal base layer and an emitter layer are selectively epitaxially grown in sequence on the exposed regions of the external base layer, the semi-insulation layer and the collector layer. An emitter electrode is formed in a self-aligned manner through the opening of the insulation film. Thus, transistor performance is improved and element size accuracy is improved.

5 Claims, 4 Drawing Sheets

METHOD OF MANUFACTURING A HETEROJUNCTION BIPOLAR TRANSISTOR INVOLVING ETCH AND REFILL

BACKGROUND OF THE INVENTION

1. Field of the Invention

The present invention relates to a heterojunction bipolar transistor and a method of manufacturing the same. More particularly, the invention relates to a heterojunction bipolar transistor and a method of manufacturing the same, which improves transistor performance and accuracy of element size.

2. Discussion of Background

FIG. 6 is a sectional view showing an example of a conventional heterojunction bipolar transistor, which is manufactured by a method described in IEEE Electron Device Letters, Vol. EDL-5 (1984), p. 310.

This heterojunction bipolar transistor is formed by a semi-insulating substrate 1 which is provided thereon with a subcollector layer 3 in a region enclosed by semi-insulating regions 2 for purposes of inter-element isolation. Semi-insulating layers 4 are provided on the subcollector layer 3 so as to enclose a collector layer 5. An internal base layer 6 is formed on the collector layer 5 and external base layers 7 are formed on the semi-insulating layers 4 respectively. An emitter layer 8 and a cap layer 9 are formed on the internal base layer 6. Base electrodes 10 are formed on the external base layers 7, while an emitter electrode 11 is formed on the cap layer 9 and a collector electrode 12 is formed on the subcollector layer 3 respectively. Semi-insulating regions 13, for purposes of inter-electrode isolation, are formed between the base electrodes 10 and the emitter electrode 11.

Such a heterojunction bipolar transistor is generally manufactured in the following manner:

First, a subcollector layer 3, a collector layer 5, an internal base layer 6, an emitter layer 8 and a cap layer 9 are sequentially epitaxially grown on the semi-insulating substrate 1.

Then, photoresist patterns for forming the external base layers 7 through photolithography or the like are formed on the cap layer 9 to perform ion implantation, e.g., beryllium atoms, by utilizing the photoresist patterns as masks, thereby to form the external base layers 7. Subsequently, oxygen atoms are ion-implanted through the said photoresist patterns into regions deeper than the external base layers 7, to form the semi-insulating layers 4 directly under the external base layers 7.

Thereafter the ion-implanted regions are annealed, i.e., the ion-implanted impurities are activated through heat treatment. Then the base electrodes 10 are formed on the external base layers 7 and subsequently the emitter electrode 11 is formed on the cap layer 9 which is then to be subjected to alloy processing. In order to form the collector electrode 12, a portion of the device thus far formed which corresponds with the location of the collector electrode 12 is removed by selective etching to reach the subcollector layer 3. Then the collector electrode 12 is formed on the subcollector layer 3.

Finally, boron atoms, for example, are ion-implanted to form the semi-insulating regions 13 for inter-electrode isolation and the semi-insulating regions 2 for inter-element isolation.

However, such a conventional method of manufacturing the heterojunction bipolar transistor has the following disadvantages: Ion implantation and annealing must be performed in order to form the external base layers 7 and the semi-insulating layers 4 respectively, whereby the crystal structure of the ion-implanted regions is broken and the impurities are diffused by the annealing after ion implantation, to lower the transistor performance. Further, the element size is not accurately defined since ion implantation of the external base layers 7 and formation of the emitter and base electrodes 11 and 10 is not performed in a self-aligned manner.

SUMMARY OF THE INVENTION

The present invention is directed to a heterojunction bipolar transistor and a method of manufacturing the same.

The inventive heterojunction bipolar transistor comprises a semi-insulating substrate, a first conductivity type collector layer formed on the upper part of the semi-insulating substrate, a semi-insulating layer formed on the collector layer, a second conductivity type external base layer formed on the semi-insulating layer, an insulation film formed on the external base layer and provided with an opening in a required position, a cavity obtained by mesa etching regions of the external base layer, the semi-insulating layer and the collector layer corresponding to the opening of the insulation film which is utilized as a mask, a second conductivity type internal base layer formed on the exposed regions of the external base layer, the semi-insulating layer and the collector layer in the cavity, a first conductivity type emitter layer formed on the internal base layer in the cavity and an emitter electrode formed in a self-aligned manner through the opening of the insulation film to be electrically connected with the emitter layer.

The inventive method of manufacturing a heterojunction bipolar transistor comprises a first step of sequentially epitaxially growing a first conductivity type collector layer, a semi-insulating layer and a second conductivity type external base layer on the upper part of a semi-insulating substrate, a second step of forming a cavity in which the external base layer, the semi-insulating layer and the collector layer are exposed by performing selective mesa etching from the external base layer to the collector layer utilizing a selectively opened insulation film as a mask, a third step of sequentially growing a second conductivity type internal base layer and a first conductivity type emitter layer in the cavity by utilizing the insulation film as a mash and a fourth step of forming an emitter electrode in a self-aligned manner through the opening of the insulation film.

Accordingly, a principal object of the present invention is to provide a heterojunction bipolar transistor and a method of manufacturing the same which can improve transistor performance as well as accurately define element size.

According to the present invention, the semi-insulating layer and the external base layer sequentially epitaxially grown on the collector layer are selectively mesa-etched to expose the external base layer, the semi-insulating layer and the collector layer. Subsequently the internal base layer and the emitter layer are selectively epitaxially grown in sequence thereby to simultaneously attain the collector-base junction and the internal base-external base junction. In other words, the inventive method requires no ion implantation or annealing, whereby transistor performance can be improved with no problem such as breakage of crystal structure following ion implantation or impurity diffusion following annealing. Further, the emitter electrode is formed in a self-alignment manner through the pattern opening of the insulation film, whereby the element size can be accurately defined.

These and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
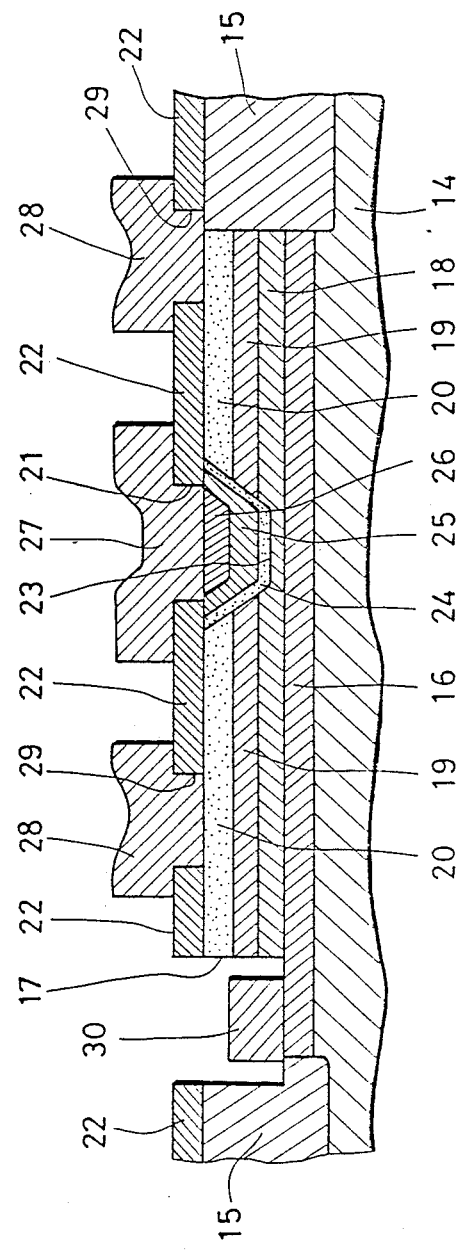
FIG. 1 is a sectional view showing a heterojunction bipolar transistor according to an embodiment of the present invention.

FIG. 1 is a sectional view showing a heterojuction bipolar transistor according to an embodiment of the present invention. In the heterojunction bipolar transistor as shown in FIG. 1, an n+-type subcollector layer 16 of GaAs is formed in a region enclosed by semi-insulating regions 15 for inter-element isolation on a semi-insulating substrate 14 of GaAs. An n−-type collector layer 18 of GaAs is formed on the subcollector layer 16 to avoid an electrode cavity 17. A semi-insulating layer 19 is formed on the collector layer 18, while a p+-type external base layer 20 of GaAs is formed on the semi-insulating layer 19. Further, an insulation film 22 having an opening 21 is formed on the external base layer 20. A cavity 23 is obtained by mesa etching regions of the external base layer 20, the semi-insulating layer 19 and the collector layer 18 corresponding to the opening 21 by utilizing the insulation film 22 as a mask, so that a p+-type internal base layer 24 of GaAs, an n-type emitter layer 25 of AlGaAs and an n+-type cap layer 26 of GaAs are sequentially formed in lamination in the cavity 23. An emitter electrode 27 is formed in a self-alignment manner through the opening 21 of the insulation film 22, to be connected with the cap layer 26 and the emitter layer 25. Base electrodes 28 are connected with the external base layer 20 via through holes 29 formed in the insulation film 22. A collector electrode 30 is connected with the subcollector layer 16 through the electrode cavity 17.

The following description concerns a method of manufacturing the heterojunction bipolar transistor.

Figure 2:
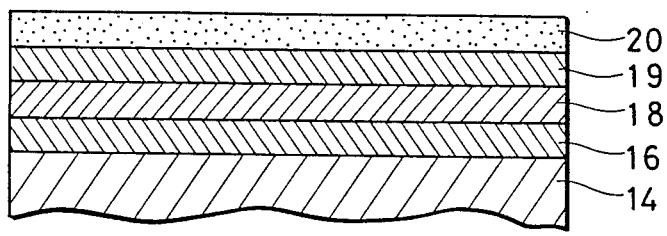
FIGS. 2 to 5 illustrate a method of manufacturing the heterojunction bipolar transistor.

First, a subcollector layer 16, a collector layer 18, a semi-insulating layer 19 and an external base layer 20 are sequentially epitaxially grown on a semi-insulating substrate 14 as shown in FIG. 2.

Figure 3:
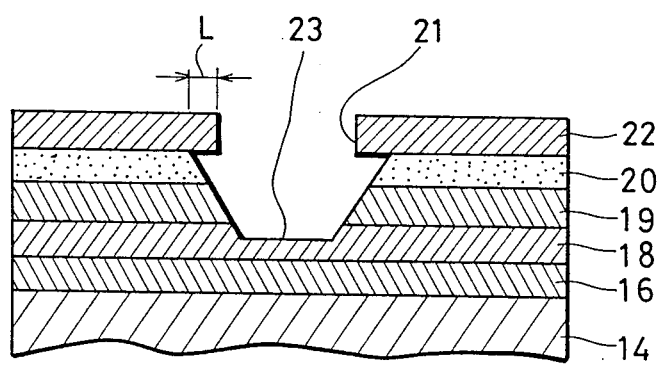

Then, as shown in FIG. 3, an insulation film 22 is deposited on the external base layer 20, to form an opening 21 in a required portion of the insulation film 22 through photolithography or the like. The insulation film 22 formed with the opening 21 is utilized as a mask to perform selective mesa etching from the external base layer 20 to the collector layer 18, to form a cavity 23 in which the external base layer 20, the semi-insulating layer 19 and the collector layer 18 are exposed. In the step as shown in FIG. 3, for example, a (100) GaAs substrate may be employed to be etched by a solution of 4H$_2$SO$_4$/1H$_2$O$_2$/1H$_2$O to obtain a ($\bar{1}$10) section as shown in FIG. 3. (refer to Jpn. J. Appl. Phys. Vol. 25 (1986) L10).

Figure 4:
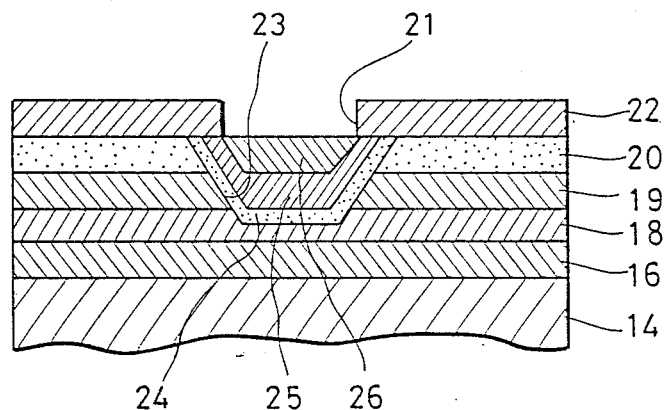

Thereafter the epitaxial layers are sequentially grown through organo-metal vapor phase epitaxy, for example, so that the epitaxial layers are not grown over the insulation film 22 but selectively grown only in the cavity 23 which is a mesa-etched portion. Thus the respective epitaxial layers of an internal base layer 24, an emitter layer 25 and a cap layer 26 can be formed in the cavity 23 as shown in FIG. 4. In this case, the internal base layer 23 is formed to entirely cover the exposed regions of the external base layer 20, the semi-insulating layer 19 and the collector layer 18, while the thickness of the internal base layer 23 is set to be smaller than the width L of side etching of the cavity 23 as shown in FIG. 3, so that the internal base layer 23 is not in contact with an emitter electrode 27 to be thereafter formed. Through the aforementioned step, the collector-base junction and the internal base-external base junction are simultaneously attained.

Figure 5:
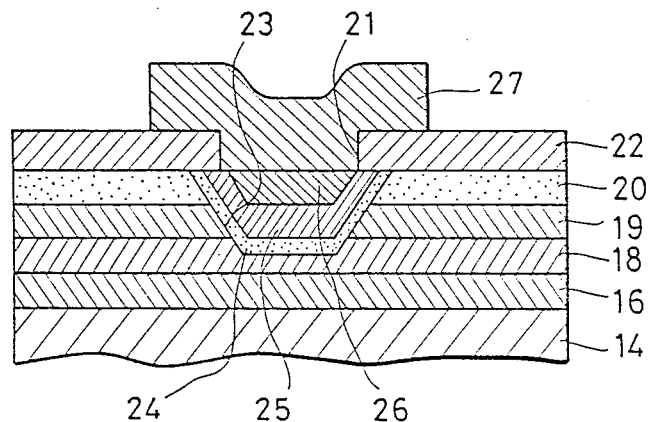
Figure 6:
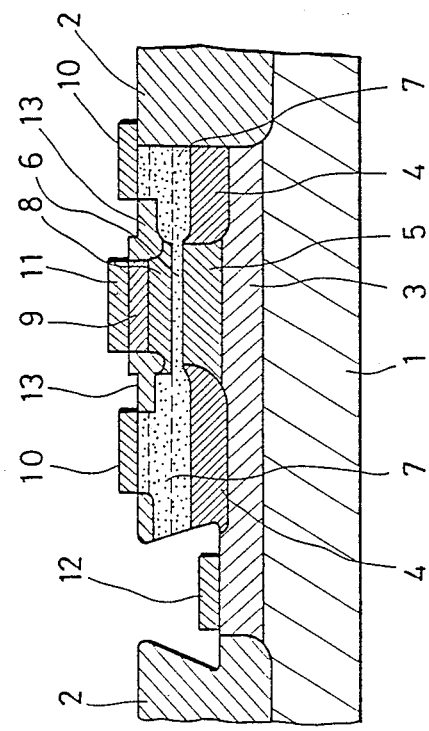
FIG. 6 is a sectional view showing a conventional heterojunction bipolar transistor.

Then, as shown in FIG. 5, the emitter electrode 27 is formed in a self-aligned manner through the opening 21 of the insulation film 22. Further, through holes 29 are formed in the insulation film 22 as shown in FIG. 1, to form base electrodes 28 to be connected with the external base layers 20 via the through holes 29. Further, an electrode cavity 17 is formed by etching or the like from the insulation film 22 to the subcollector layer 16, to form a collector electrode 30 on the exposed region of the subcollector layer 16 through the electrode cavity 17. Semi-insulating regions 15 for inter-element isolation can be formed by ion-implanting boron atoms or the like into required regions after the subcollector layer 16, the collector layer 18, the semi-insulating layer 19 and the external base layer 20 are epitaxially grown on the semi-insulating substrate 14 as shown in FIG. 2, for example.

According to the aforementioned method, the semi-insulating layer 19 and the external base layer 20 sequentially epitaxially grown on the collector layer 18 are selectively mesa-etched to expose the external base layer 20, the semi-insulating layer 19 and the collector layer 18 thereby to selectively epitaxially grow the internal base layer 24, the emitter layer 25 and the cap layer 26 in sequence, whereby the collector-base junction and the internal base-external base junction can be simultaneously attained. In other words, the aforementioned method requires no ion implantation or annealing, whereby the transistor performance can be improved with no problem such as breakage of crystal structure following ion implantation or diffusion of impurities following annealing. Further, the emitter electrode 27 is formed in a self-alignment manner through the opening 21 of the insulation film 22, whereby the exactness of the element size can be improved. In addition, the internal base layer 24 is formed independently of the external base layer 20 through selective epitaxial growth, whereby the external base layer 20 can be formed to have a greater thickness and have a high impurity concentration with no regard to the internal base layer 24, so that the resistance of the external base layer 20 can be set at a small value. Further, the external base layer 20 is formed in the uppermost part as an epitaxial layer, so that it can be easily brought into contact with the base electrodes 28 by simply providing the through holes 29 in the insulation film 22.

The present invention is also applicable to such case where the n-type and p-type polarities in the above embodiment are reversible, as a matter of course.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a heterojunction bipolar transistor, said method comprising:
    a first step of sequentially epitaxially growing a first conductivity type collector layer, a semi-insulating layer and a second conductivity type external base layer on the upper part of a semi-insulating substrate;
    a second step of performing selective mesa etching from said external base layer to said collector layer by utilizing a insulation film having a selectively formed opening as a mask to form a cavity exposing said external base layer, said semi-insulating layer and said collector layer;
    a third step of sequentially epitaxially growing a second conductivity type internal base layer and a first conductivity type emitter layer in said cavity by utilizing said insulation film as a mask; and
    a fourth step of forming an emitter electrode in a self-aligned manner through said opening of said insulation film.

2. A method of manufacturing a heterojunction bipolar transistor in accordance with claim 1, further including a step of epitaxially growing a first conductivity type subcollector layer between said semi-insulating substrate and said collector layer.

3. A method of manufacturing a heterojunction bipolar transistor in accordance with claim 1, further including a step of epitaxially growing a first conductivity type cap layer on said emitter layer.

4. A method of manufacturing a heterojunction bipolar transistor in accordance with claim 1, further including a step of forming a base electrode and providing a through hole in said insulation film to form a base electrode connection to said external base layer via said through hole.

5. A method of manufacturing a heterojunction bipolar transistor in accordance with claim 2, further including a step of forming an electrode cavity from said insulation film to said subcollector layer to form a collector electrode on an exposed region of said subcollector layer in said electrode cavity.

* * * * *